US010686006B2

(12) United States Patent
Kao et al.

(10) Patent No.: US 10,686,006 B2
(45) Date of Patent: Jun. 16, 2020

(54) LIGHT SOURCE DEVICE AND DISPLAY DEVICE USING THE SAME

(71) Applicant: Darwin Precisions Corporation, Taichung (TW)

(72) Inventors: Chen-Chia Kao, Taichung (TW); Yu-Shan Shen, Taichung (TW)

(73) Assignee: DARWIN PRECISIONS CORPORATION, Taichung (TW)

( * ) Notice: Subject to any disclaimer, the term of this patent is extended or adjusted under 35 U.S.C. 154(b) by 0 days.

(21) Appl. No.: 16/293,069

(22) Filed: Mar. 5, 2019

(65) Prior Publication Data

US 2019/0280044 A1 Sep. 12, 2019

(30) Foreign Application Priority Data

Mar. 6, 2018 (TW) ............................ 107107483 A

(51) Int. Cl.

| | |
|---|---|
| ***H01L 27/15*** | (2006.01) |
| ***F21K 9/20*** | (2016.01) |
| ***G02F 1/1333*** | (2006.01) |
| ***G02F 1/13357*** | (2006.01) |
| ***F21V 5/04*** | (2006.01) |
| ***H01L 33/58*** | (2010.01) |
| ***H01L 25/075*** | (2006.01) |
| ***H01L 27/32*** | (2006.01) |

(52) U.S. Cl.

CPC .............. *H01L 27/156* (2013.01); *F21K 9/20* (2016.08); *F21V 5/04* (2013.01); *G02F 1/133308* (2013.01); *G02F 1/133603* (2013.01); *H01L 27/3225* (2013.01); *H01L 33/58* (2013.01); *G02F 2001/133314* (2013.01); *G02F 2001/133607* (2013.01); *H01L 25/0753* (2013.01)

(58) Field of Classification Search

CPC ... G02F 1/133603; G02F 2001/133607; F21V 5/007; F21V 5/046

See application file for complete search history.

(56) References Cited

U.S. PATENT DOCUMENTS

| | | | | |
|---|---|---|---|---|
| 7,621,657 | B2 | 11/2009 | Ohkawa | |
| 8,833,979 | B2 | 9/2014 | Wang et al. | |
| 8,926,114 | B2 * | 1/2015 | Park | F21K 9/60 362/97.1 |
| 9,890,924 | B2 * | 2/2018 | Ha | F21V 5/048 |
| 10,047,930 | B2 * | 8/2018 | Kim | F21K 9/64 |
| 10,060,579 | B2 * | 8/2018 | Kim | G02B 19/0066 |
| 10,139,077 | B2 * | 11/2018 | Kang | G02B 19/0014 |

(Continued)

*Primary Examiner* — William N Harris

(74) *Attorney, Agent, or Firm* — WPAT, PC

(57) ABSTRACT

The present invention discloses a light source device applied to a display module. The light source device produces an emission light field which forms a light field shape when projected in a normal direction onto a planar surface substantially parallel to a placement plane of the light source device. The light field shape includes a light field center, more than three intense light regions, and more than three dim light regions. The intense light regions and the dim light regions are alternately disposed, and radially arranged around the light field center. A light brightness at a predetermined distance from the light field center in the dim light region is less than 90% of a light brightness at the predetermined distance from the light field center in the intense light region.

7 Claims, 7 Drawing Sheets

(56) References Cited

U.S. PATENT DOCUMENTS

| | | | | |
|---|---|---|---|---|
| 10,295,149 | B2 * | 5/2019 | Kang | F21V 5/04 |
| 2008/0100773 | A1 * | 5/2008 | Hwang | G02B 3/005 349/62 |
| 2009/0207586 | A1 * | 8/2009 | Arai | G02B 5/021 362/97.1 |
| 2011/0116272 | A1 * | 5/2011 | Bak | F21V 5/04 362/296.01 |
| 2011/0279751 | A1 * | 11/2011 | Iiyama | F21V 5/04 349/64 |
| 2013/0083541 | A1 * | 4/2013 | Fang | F21V 5/007 362/311.02 |
| 2013/0215336 | A1 | 8/2013 | Miyata | |
| 2013/0229808 | A1 * | 9/2013 | Wang | F21V 5/04 362/311.01 |
| 2014/0004995 | A1 | 1/2014 | Bolenbaugh et al. | |
| 2015/0117029 | A1 * | 4/2015 | Dai | G02B 19/0014 362/311.06 |
| 2017/0234507 | A1 * | 8/2017 | Kang | F21V 5/007 362/237 |

* cited by examiner

LIGHT SOURCE DEVICE AND DISPLAY DEVICE USING THE SAME

BACKGROUND

Technical Field

The present invention relates to a light source device and a display device using the same. Particularly, the present invention relates to a light source device having a specific light field shape and a display device using the same.

Related Art

In various technical fields, particularly in the field of display technologies and lighting equipment, a related design of a light source is an important key factor. Traditionally, a lamp bulb or a lamp tube is generally used as a light source. However, as the technology of light-emitting diodes (LEDs) matures, LEDs with advantages of energy saving and miniaturization have gradually become mainstream light sources on the market.

In an optical module using LEDs, in order to make the emitted light have specific characteristics, the LEDs are subjected to secondary optical design. The secondary optical design includes configuration of a pattern of the LEDs, design of a secondary lens and the like. Generally, referring to FIG. 1, the LEDs in the optical module are arranged in a matrix form. A light field 80 emitted by the LEDs arranged in the matrix form may produce a shadow 55 between cross-pitches of a couple of light sources or at the respective corners. This shadow is easily perceived by a viewer, which degrades the display quality demonstrated by the entire LED matrix.

SUMMARY

Technical Means for Solving the Problems

In order to solve the above-mentioned problems, one embodiment of the present invention provides a light source device having a specific light field shape and a display device using the same.

According to one embodiment of the present invention, the light source device is applied to a display module. The light source device produces an emission light field which forms a light field shape on a perpendicular projection plane. The light field shape includes: a light field center; more than three intense light regions radially arranged around the light field center; and more than three dim light regions radially arranged around the light field center and respectively located between adjacent intense light regions. According to one embodiment of the present invention, a light brightness at a predetermined distance from the light field center in the dim light region is less than 90% of a light brightness at the predetermined distance from the light field center in the intense light region.

According to another embodiment of the present invention, the light source device is applied to a display module. The light source device produces an emission light field which forms a square light field shape on a perpendicular projection plane. After a square luminance appearance is normalized, the range 2.0 times the full width at half maximum range of the square luminance appearance is divided into 12 equal parts. A circular light field is extracted from each of the equal parts and each circular light field includes a light field center, more than three intense light regions, more than three moderate light regions and more than three dim light regions. The intense light regions, the moderate light regions and the dim light regions are alternately disposed. A light brightness uniformity of the dim light regions, the moderate light regions and the intense light regions in each of independent concentric circles is less than 90%.

According to one embodiment of the present invention, the display device includes a backlight module which has a back bazel and the plurality of light source devices disposed on the back bazel in a matrix form. Two adjacent light source devices in the closest arrangement direction are adjacent to each other by the dim light regions.

According to another embodiment of the present invention, the display device includes a backlight module which has a back bazel and the plurality of light source devices disposed on the back bazel in a matrix form. One of the inner wall surfaces of one light source device is facing one of the inner wall surfaces of another adjacent light source device in the closest arrangement direction.

Technical Effects Achieved by the Technical Means

According to the various embodiments, the present invention provides the light source device having the specific light field shape and the display device using the same. By virtue of the above-mentioned light source device and the display device using the same, shadows between cross-pitches of a couple of light sources or at the respective corners of light sources may be reduced in the light emitted by the light source devices arranged in the matrix form. The entire optical uniformity and the display quality may be enhanced due to the reduction of the shadows, and a watching or using experience of a user of the light source device and the display device using the same may be improved.

DETAILED DESCRIPTION

Figure 1:
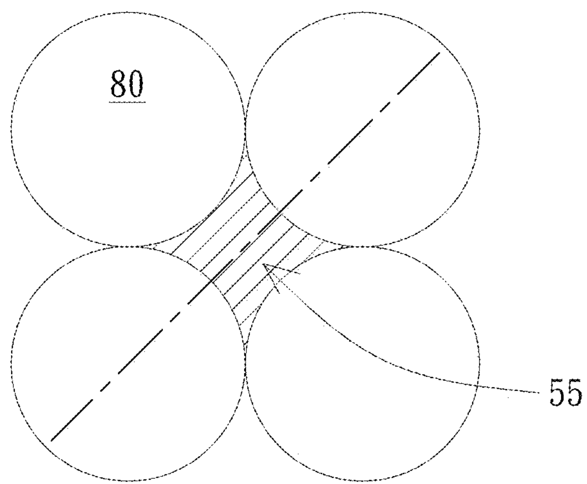
FIG. 1 is a schematic diagram of a shadow produced between cross-pitches of a light field in the prior art.

Various embodiments will be described below, and it is readily for those skilled in the art to understand the spirit and principle of the present invention by referring the illustrative and accompanying diagrams. Although some specific embodiments are specifically described herein, these embodiments are only exemplary and are not considered to be restrictive or exhaustive in all aspects. Therefore, those skilled in the art can apparently and readily make various changes and modifications to the present invention without departing from the spirit and principle of the present invention.

The present invention provides a light source device. In a preferred embodiment, the light source device takes a light emitting diode as a light source. However, in different embodiments, the light source device also adopts other light sources having light emitting regions, such as an organic light emitting display element. In addition, the present invention further provides a display device, including the above-mentioned plurality of light source devices, but it is just exemplary. Furthermore, the light source device of the present invention may be applicable to various display modules without departing from the scope of the present invention.

Herein, one embodiment of the present invention shown in FIGS. 2 to 4A will be described. First, referring to FIGS. 2 and 3, in the embodiment of the present invention, the light source device 1 mainly includes a lens 100 and a light source 300. The lens 100 has a light emitting top surface 110 and a bottom surface 130 which are opposite, and an outer wall surface 150 extending from the bottom surface 130 and connected to the light emitting top surface 110.

Figure 2:
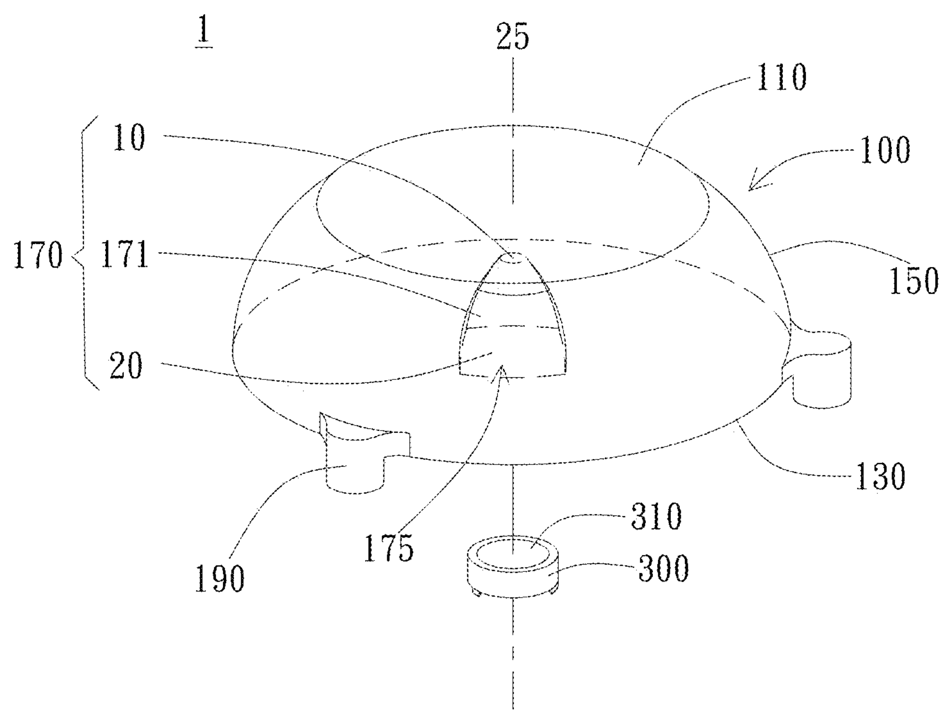
FIG. 2 is an exploded view of a light source device according to one embodiment of the present invention.

In the present embodiment, the light emitting top surface 110 and the bottom surface 130 are both circular planes. However, in different embodiments, the light emitting top surface 110 and the bottom surface 130 are also hexagonal or of other polygonal shapes. Or, the light emitting top surface 110 is circular, and the bottom surface 130 is hexagonal, or the other way around. The light emitting top surface 110 is preferably smaller than the bottom surface 130, and the outer wall surface 150 is preferably an outwards protruding curved surface, so that the entire lens 100 is of an outwards protruding shape. In the embodiment as shown in FIG. 2, the light emitting top surface 110 and the outer wall surface 150 are obviously isolated different surfaces. For example, the light emitting top surface 110 is a plane parallel to the bottom surface 130, and the outer wall surface 150 is a curved surface keeping a certain angle with the bottom surface 130. However, the present invention is not limited therein, and the light emitting top surface 110 and the outer wall surface 150 may be a continuous surface without an edge there between.

The lens 100 is preferably made of a transparent material, such as transparent plastic or glass. However, in different embodiments, the lens 100 may be also made of a light transmitting material, and also includes different kinds of inclusions such as particles according to different design requirements. In an embodiment, the lens may be made of a material with high refractive index and high light transmittance, such as polymethyl methacrylate (PMMA) and polycarbonate (PC), so that light emitted by the light source 300 has a specific light emitting angle and uniformity after being refracted via the lens 100.

According to an embodiment of the present invention, a hole 170 inwards sunken towards the light emitting top surface 110 is formed in the bottom surface 130 of the light source device 1.

Figure 3:
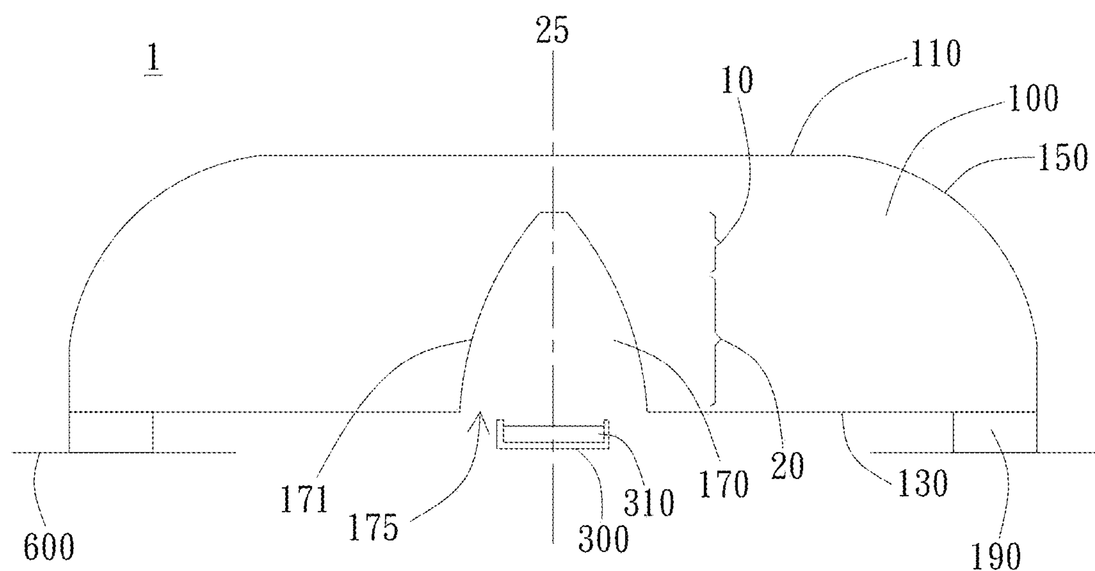
FIG. 3 is a cross-sectional view of a light source device according to one embodiment of the present invention.

In the embodiment as shown in FIGS. 2 and 3, the outer wall surface 150 and the inner wall surface 171 are both closer to a center 25 when closer to the light emitting top surface 110, and the light emitting top surface 110 has a planar characteristic. In addition, the outer wall surface 150 is an outwards protruding annular arc-shaped curved surface, and the inner wall surface 171 is an annular arc-shaped curved surface sunken towards the outer wall surface 150. By virtue of this design, after the light enters the lens 100 via the inner wall surface 171 and is refracted, the possibility of the light being emitted out of the outer wall surface 150 is decreased, and then the emitted light is guided to the light emitting top surface 110. However, the present invention is not limited therein, and it is available to design that part of the emitted light is guided to the outer wall surface 150.

In the embodiments as shown in FIGS. 2 and 3, the light source 300 is disposed below an opening 175 (which will be described in detail below) of the bottom surface 130. That is, when the hole 170 is defined to be formed above the opening 175, the light source 300 is disposed below the opening 175 and corresponds to the hole 170. When the light source 300 emits light or implements illumination, at least part of a projection range of a light emitting region 310 of the light source 300 on the bottom surface 130 is included in the opening 175. In addition, as shown in FIGS. 2 and 3, three supporting legs 190 are configured to locate the light source device 1 onto a placement plane 600. However, the present invention is not limited therein, and the light source device 1 according to the present invention may have supporting legs in a different number, or may not include the supporting legs and is disposed in other ways. In an embodiment, the light source device 1 may be hung on another element via a fixing member, or directly set on the placement plane 600 without supporting legs. Herein, the placement plane 600 is defined as a virtual plane for locating the entire light source device 1, and is not certainly a surface of a substantially existing substrate or element.

Figure 4A:
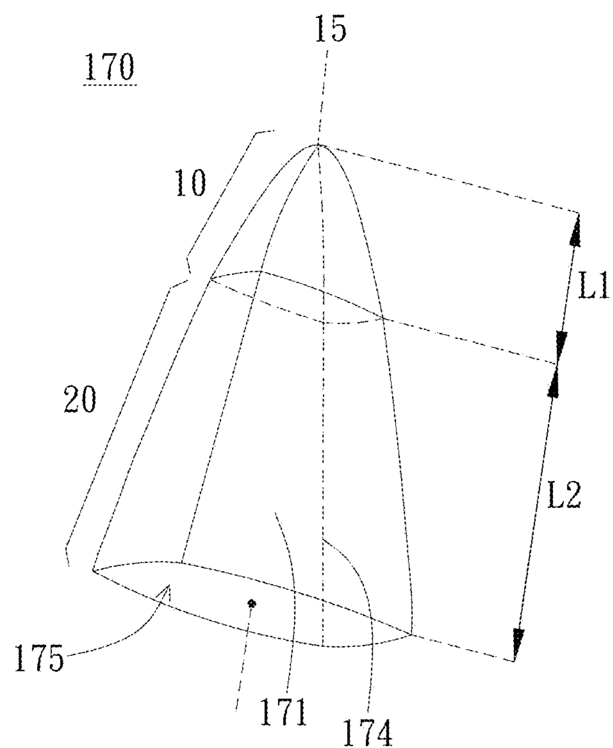
FIGS. 4A to 4C are respectively schematic diagrams of holes and openings of light source devices according to various embodiments of the present invention.
Figure 4B:
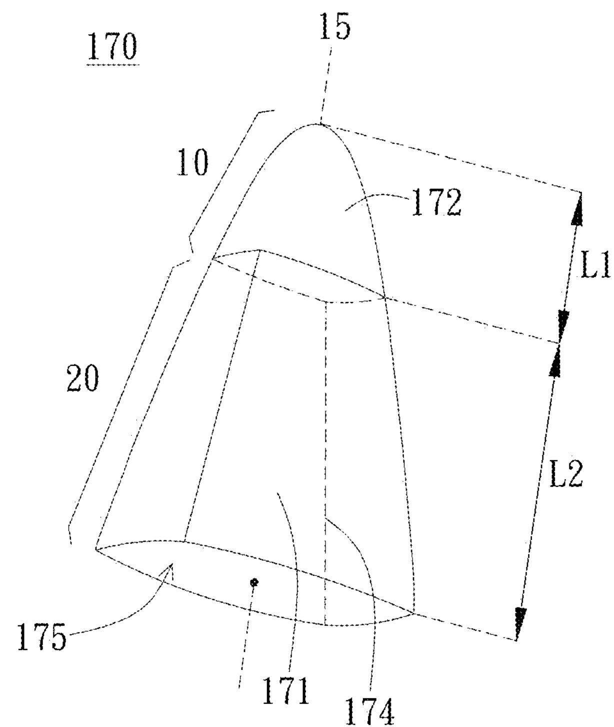

Then, referring to FIGS. 2, 3, 4A and 4B together, the hole 170 is of a bullet-shaped structure composed of an upper cavity 10 and a lower cavity 20. A difference between the embodiments as shown in FIGS. 4A and 4B is the shape of the upper cavity. In the embodiment as shown in FIG. 4A, the upper cavity 10 and the lower cavity 20 substantially have no difference and both are formed by at least three inner wall surfaces 171, and concave edges 174 continuously extend from the lower cavity 20 to the upper cavity 10. On the contrary, in the embodiment as shown in FIG. 4B, the upper cavity 10 is formed by a bullet-shaped inner wall 172 without the concave edge 174, and the lower cavity 20 is formed by at least three inner wall surfaces 171, and the concave edges 174 only continuously extend in the lower cavity 20. Herein, the embodiments as shown in FIGS. 4A and 4B are both composed of four inner wall surfaces 171. However, the present invention is not limited therein. Specifically, the hole 170 may be composed of more than three inner wall surfaces, such as three, four, five or more than five inner wall surfaces.

In FIGS. 4A and 4B, the upper cavities 10 are communicated with the lower cavities 20. In FIG. 4A, the upper cavity 10 and the lower cavity 20 are substantially the same cavity. In the embodiment as shown in FIG. 4B, the inner wall surfaces 171 are respectively connected to the bullet-shaped inner wall 172 to enable the lower cavity 20 to be communicated with the upper cavity 10. In addition, in FIGS. 4A and 4B, at the position that the lower cavity 20 is connected to the bottom surface 130, the bottom ends of the inner wall surfaces 171 enclose and form the opening 175 in the bottom surface 130. The opening 175 formed in the bottom surface 130 is close to the lower cavity 20 and keeps a certain spacing length L2 away from the upper cavity 10. This spacing length L2 is also the height of the lower cavity 20. In addition, the height of the upper cavity 10 is a length L1 as shown in FIGS. 4A and 4B. In the embodiments as shown in FIGS. 4A and 4B, the inner wall surfaces 171 are mutually connected to the concave edges 174, and the concave edges 174 extend from the opening 175 towards the light emitting top surface 110 till reaching the top of the hole 170 or an intersection of the inner wall surfaces 171 and the bullet-shaped inner wall 172. Specifically, the inner wall surfaces 171 are arc surfaces. The curvature of an arc formed by each of the inner wall surfaces 171 at a position close to each of the concave edges 174 is relatively smaller than that at a position away from the concave edges 174 along a cross section parallel to the bottom surface 130. This feature enables the light emitted through the opening 175 to have a light shape of a square light, and the characteristics of the square light will be further described in detail below.

Figure 4C:
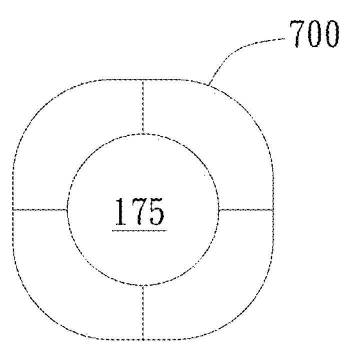

FIG. 4C is another embodiment different from those in FIGS. 4A and 4B and only shows a top view of the opening 175. As shown in FIG. 4C, the opening 175 is of a substantially square shape having fillets 700 instead of a non-fillet shape as shown in FIGS. 4A and 4B. Herein, the embodiment as shown in FIG. 4C has no definite edges, but the entire is still close to a square shape, so that the light emitted through the opening 175 still has the light shape relatively close to the square light. In the present embodiment, if an R value of each of the fillets 700 is larger, the opening is closer to a circular shape, so the R value of each of the fillets 700 is required to be relatively small in order to exhibit the square light. However, the R value is preferably more than 0.8 to exhibit a preferably square light field. A critical value of each of the fillets correspondingly changes according to the characteristics of the type of the light source shape, the module design and the luminance and the like and the characteristics of the structure, the material and the like of the lens 100, so that there is no limitation to specific values herein. That is, fillets 700 capable of specifically correspondingly forming the square light are adjusted according to the design of the light source and the lens. However, the openings 175 as shown in FIGS. 4A to 4C are only exemplary, and the present invention is not limited therein. In an embodiment, the opening 175 may be of a polygonal shape in addition to the square.

Then, a preferable emission light field of the light source device according to the above-mentioned embodiments of the present invention will be described referring to FIGS. 4A to 4C and FIGS. 5A and 5B.

Figure 5A:
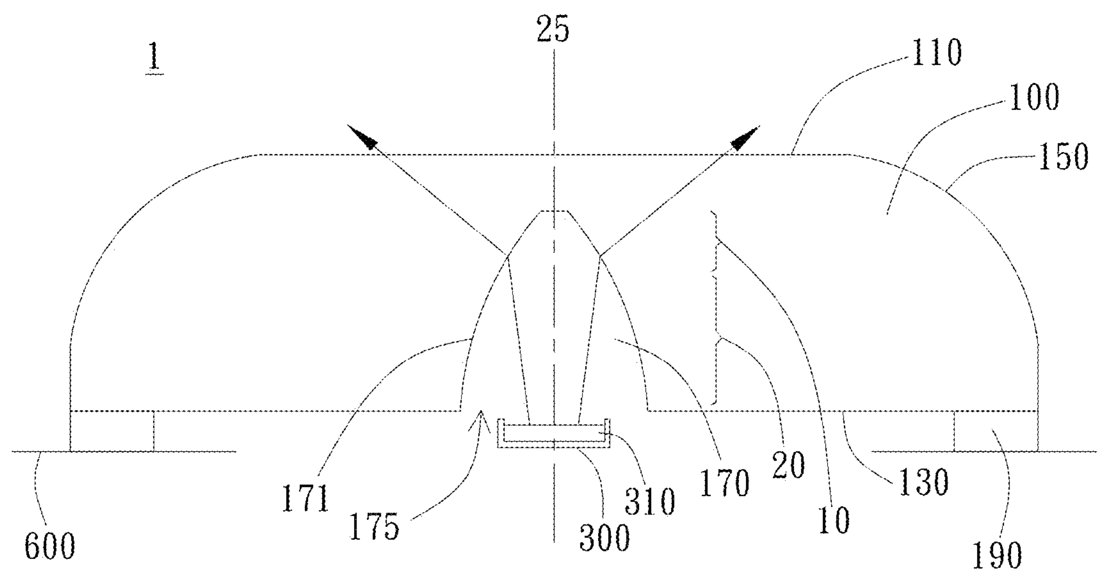
FIGS. 5A and 5B are schematic diagrams of light paths and light fields emitted by the light source devices of FIGS. 2 to 4C according to one embodiment of the present invention.
Figure 5B:
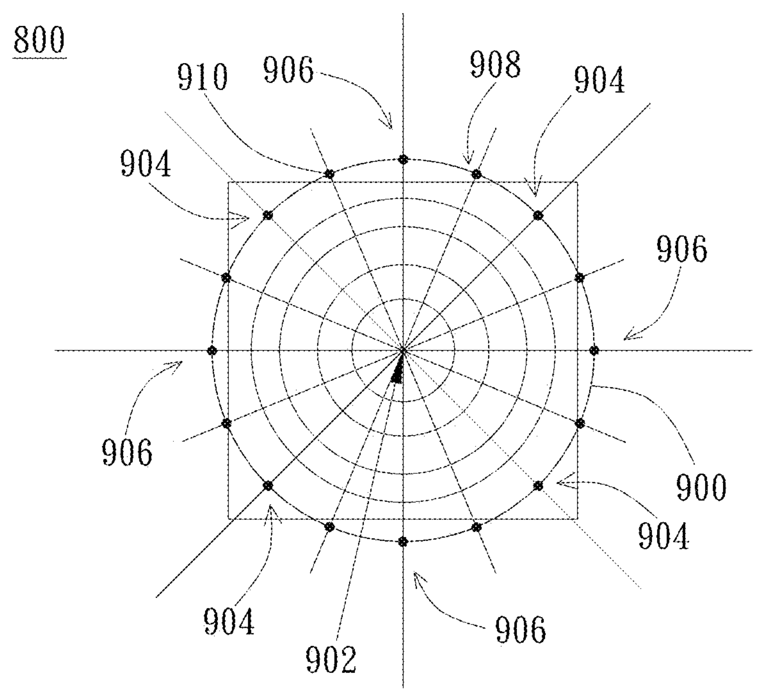

FIG. 5A shows a light path graph of the light source device of the embodiments as shown in FIGS. 1 to 4C. The arrow shows a path of light emitted from the light source 300. FIG. 5B shows an emission light field 800 produced by the light source device 1. According to the preferred embodiment of the present invention, as the light source 300 is disposed below the hole 170, the light emitted by the light emitting region 310 of the light source 300 through the hole 170 produces an emission light field 800 which forms a light field shape when projected in a normal direction onto a planar surface substantially parallel to the placement plane 600 of the light source device 1. The light field shape may present square light approximate to square.

Herein, according to one preferred embodiment of the present invention, as shown in FIG. 5B, a definition of the square light is explained. In detail, regarding a specific light field shape, after the luminance of the light shape is normalized, a range 2.0 times the full width at half maximum range of the normalized light shape is divided into 12 equal parts. One concentric circle 900 is extracted from each of the equal parts till there are 12 concentric circles 900. After that, each of the straight lines radially extracted at an interval of every 22.5 degrees is crossed with each of the concentric circles 900 to obtain 16 measuring points 910 of luminance value for every concentric circle 900. If the light brightness uniformity of the 16 measuring points 910 of two adjacent concentric circles 900 of the 12 concentric circles 900 is less than 90%, then the light field shape is square light. Under the above-mentioned square light condition, the uniformity of the 16 measuring points of the most peripheral concentric circle 900 of the square light may be less than 90%. Here, referring to Formula 1, the uniformity may be calculated by dividing the maximum brightness value by the minimum brightness value in the 16 points of the same concentric circle.

uniformity (%)=minimum brightness value/maximum brightness value    Formula 1:

Herein, referring to FIGS. 4A to 5B, if an approximately square cavity is longer (a sum of the length L1 and the length L2 in the embodiment of FIG. 4A, and the length L2 in the embodiment of FIG. 4B), more concentric circles having the uniformity less than 90% are formed in the square light of the light field. That is, if the length L1 of the upper cavity 10 in the embodiment of FIG. 4B is greater, more concentric circles having the uniformity more than 90% are formed. The center of the produced emission light field is enabled to have an expected light uniformity by means of adjusting the design of the upper cavity 10 and the lower cavity 20, and the entire emission light field emits expected specific square light.

That is, the square light includes a light field center 902, multiple intense light regions 904 and multiple dim light regions 906. The intense light regions 904 and the dim light regions 906 are radially arranged around the light field center 902, and the dim light regions 906 are respectively located between adjacent intense light regions 904. Therefore, the intense light regions 904 and the dim light regions 906 are radially and alternately disposed around the light field center 902. According to the above-mentioned descriptions, a light brightness at a predetermined distance from the light field center 902 in the dim light region 906 is less than 90% of a light brightness at the predetermined distance from the light field center 902 in the intense light region 904.

Herein, the predetermined distance is preferably equal to a radius of the fourth concentric circle counted from the periphery. However, the present invention is not limited therein.

In addition, further specifically, the square light is defined as follows: after the square luminance appearance is normalized, a range 2.0 times the full width at half maximum range is divided into 12 equal parts. One circular light field is extracted from each of the equal parts and each circular light field includes a light field center 902, more than three intense light regions 904, more than three moderate light regions 908 and more than three dim light regions 906. The intense light regions 904 are respectively located between one pair of the adjacent dim light regions 906, and two pairs of the adjacent moderate light regions 908. According to the above-mentioned descriptions, according to one preferred embodiment, the light brightness uniformity of the dim light regions 906, the intense light regions 904 and the moderate light regions 908 in at least one independent concentric circle in the square light is less than 90%.

Therefore, referring to FIG. 5B, it can be seen that the intense light regions 904 correspond to corner regions of the square light, and the moderate light regions 908 and the dim light regions 906 correspond to side regions, located between the corner regions, of the square light.

Figure 6:
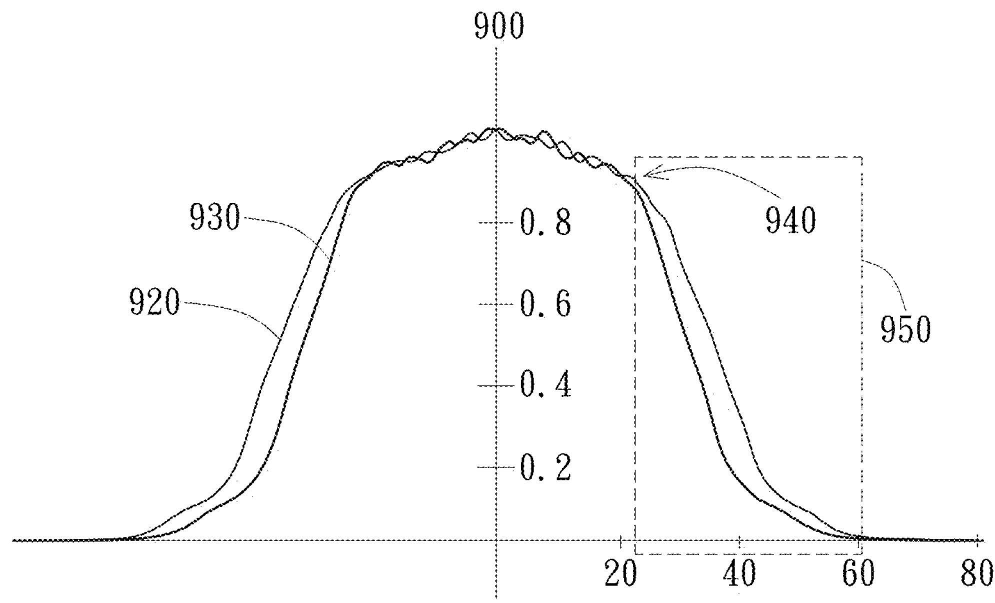
FIG. 6 is a light shape graph of luminance distribution of the light field of FIG. 5B according to one embodiment of the present invention.

Then, a cross-sectional view of a luminance light shape of a circular light and a square light will be described referring to FIG. 6.

According to one embodiment of the present invention, the square light may have a sharper luminance change than the circular light. In an embodiment, referring to FIG. 6, the circular light 920 and the square light 930 may have different luminance change slopes after being outwards diverged through a turning point 940 from the center. Specifically, compared with the circular light 920, the square light 930 may have a relatively sharper luminance change slope within a turning range 950 between the turning point 940 and a luminance-free zero point. However, the present invention is not limited therein.

The light source device 1 in the above-mentioned embodiment emits the square light 930. By virtue of such a light shape change, a contrast ratio between the highest luminance and the lowest luminance may be increased and such characteristic can be further applied to implement local dimming. In an embodiment, compared with light shape distribution of the circular light 920, the light shape distribution of the square light 930 has the advantage that the center luminance is relatively concentrated, so that the center luminance is increased and peripheral residual light is reduced therewith. When the light source device 1 with the above-mentioned characteristic is flashed off (turn off), shadows produced by the light source device 1 may be reduced. During local dimming on the basis of this characteristic, the contrast ratio and the resolution of local displaying may be increased, and the impact on the brightness of other regions is reduced, thus improving the display or light emitting quality. In further embodiments, preferably, the square light 930 may be collimated light.

Figure 7:
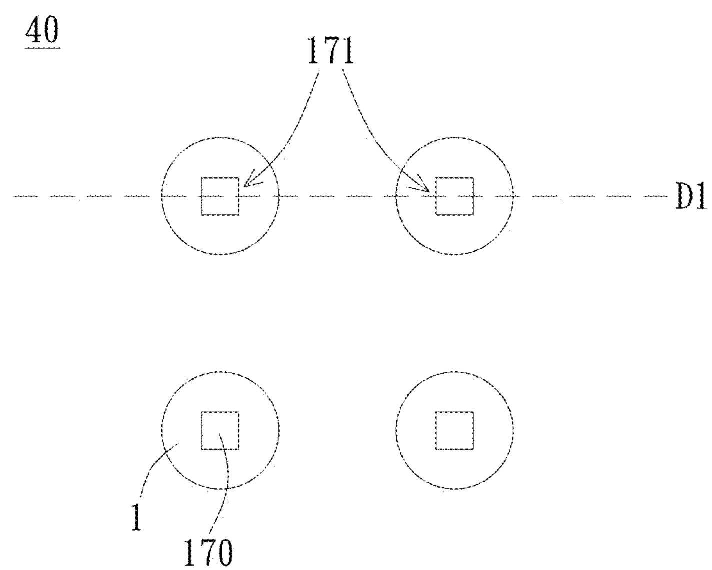
FIG. 7 is a schematic diagram of a configuration matrix of light source devices according to one embodiment of the present invention.

Next, referring to FIG. 7, a top view of a configuration matrix 40 of light source devices according to a embodiment of the present invention is further described.

FIG. 7 shows the top view of the matrix 40 formed by multiple light source devices 1 side-by-side. At least one of the inner wall surfaces 171, forming the hole 170, of one light source device 1 is facing at least one of the inner wall surfaces 171 of another adjacent light source device 1 in a closest arrangement direction D1.

Figure 8:
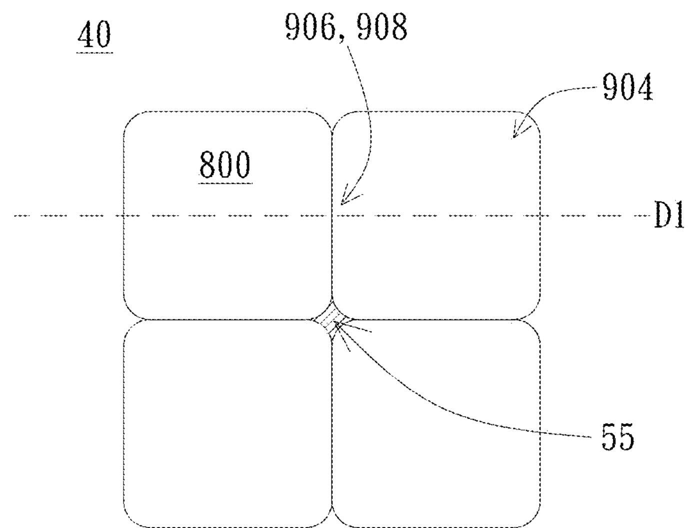
FIG. 8 is a schematic diagram of light fields emitted by the configuration matrix of the light source devices as shown in FIG. 7 according to one embodiment of the present invention.

Then, referring to FIG. 8, a top view of a light field 800 emitted by the matrix 40 of the light source devices as shown in FIG. 7 is further described.

As shown in FIG. 8, the light source devices 1 emit light fields 800 of square lights. The light fields 800 emitted by two adjacent light source devices 1 in the closest arrangement direction D1 are adjacent to each other by the dim light regions 906. It can be seen from FIG. 8 that under the matrix configuration, shadows 55 produced between cross-pitches of a couple of light source devices 1 or at the respective corners can be lowered.

Figure 9:
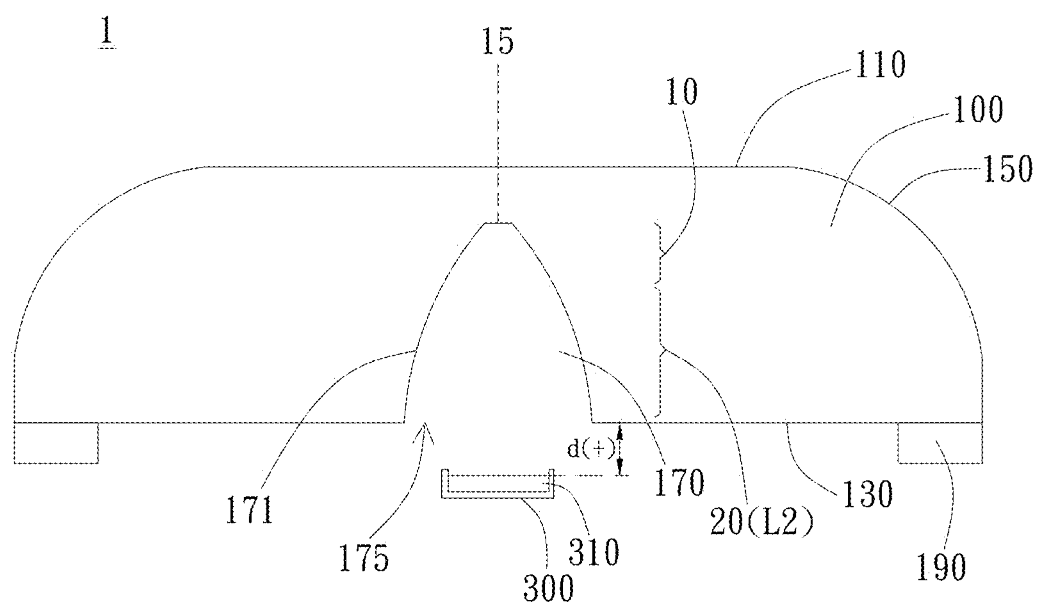
FIG. 9 is a schematic diagram of a correspondence indicating the structure and optical properties of a light source device according to one embodiment of the present invention.

The characteristics of the square light will be described referring to FIG. 9. FIG. 9 shows a partially enlarged view of the opening 175 and the light source 300 of the light source device 1. When the brightness and other optical characteristics of the light source 300 are fixed, and parts of the lens 100 except for the hole 170 are of the same structures and conditions, if a distance d between the opening 175 of the hole 170 and the light source 300 is larger, more light energy may be concentrated on an optical axis 15 of the light source 300, so that the emitted light passes through the square cavity of the hole 170, and thus the characteristics of the square light are more obvious. On the contrary, when the distance d between the opening 175 and the light source 300 is smaller, or even when the light source 300 is located inside the hole 170 (inside the hole 170, the distance d is defined as a negative value, and outside the hole 170, the distance d is defined as a positive value), as the light source 300 is closer to the upper cavity 10, the square characteristic of the square light is reduced. At the moment, the light energy may not be concentrated on the optical axis 15, and compared with the relatively large distance d, the square light of the emitted light field may become approximately circular.

In an embodiment, the aspect of FIG. 4B is taken as an example for further explanation. In detail, when the length L2 of the lower cavity 20 of the hole 170 is greater, the original emitted light is farther from the top of the hole 170 and passes through the lower cavity 20 of the hole 170 along a longer distance, the characteristics of the square light are more obvious. On the contrary, when the length L2 is shorter, the effect of the square light is weaker.

Figures 10A, 10B:
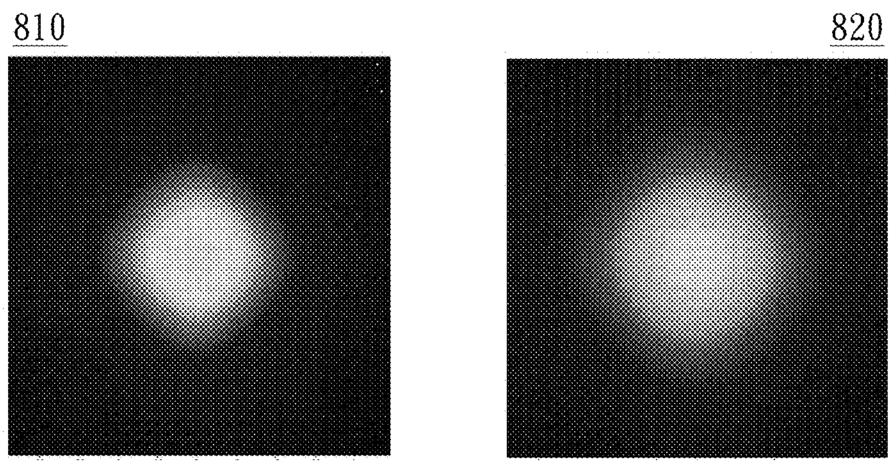
FIGS. 10A and 10B are respectively comparison diagrams of a square light and a circular light.

The effect of the square light is schematically shown in FIGS. 10A and 10B. Referring to FIGS. 10A and 10B, the embodiment of FIG. 4B is taken as an example. A light field 810 is an emission light field of an approximately square light under an adjusted distance d and a length L2 of the same light source device 1, and a light field 820 is an emission light field of an approximately circular light under another set of an adjusted distance d and a length L2 of the same light source device 1. According to the above, the distance d and the length L2 may be adjusted according to an expected light field effect. However, the distance d and the length L2 which are capable of achieving the square light correspondingly change according to the characteristics of the type of the light source 300, the module design, the luminance and the like and the characteristics of the design, the material and the like of the lens 100, so that there is no limitation to specific values herein. That is, the distance d and the length L2 which are capable of specifically correspondingly achieving the square light may be adjusted on the basis of the polygonal lower cavity 20 of the hole 170 according to the design of the light source and the lens.

Further, a display device including a matrix 40 of light source devices will be described below referring to FIG. 11.

Figure 11:
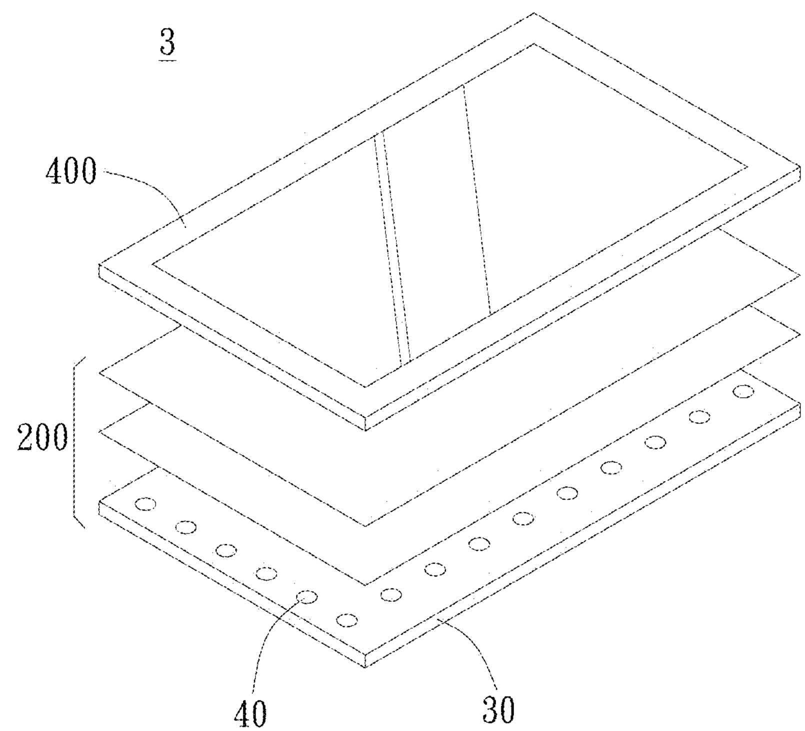
FIG. 11 is a schematic diagram of a display device including the matrix of the light source devices as shown in FIG. 7 according to one embodiment of the present invention.

Referring to FIG. 11, the display device 3 includes a backlight module 200 and a display module 400. The backlight module 200 provides a light source, which displays an expected image or content after being processed by the display module 400. Specifically, the backlight module 200 includes a back bazel 30 and a matrix 40 of light source devices disposed on the back bazel 30. The matrix 40 may be composed of any arranged light source devices in the above-mentioned embodiments.

Herein, a light field emitted by the matrix 40 may be further processed via the display module 400 and then emitted. However, the display device of the present invention is not limited therein, and the light field emitted by the matrix may be emitted without being processed via the display module, and the display module may execute other functions of the display device.

The light source device, the matrix of the light source device and the display device of the above-mentioned embodiments have display effects of fewer shadows and higher contrast ratio during emission of lights. By virtue of these display effects, the overall display uniformity and quality are improved, and then the use experience or effect of a user or a viewer is also improved.

Those skilled in the art should know that this text basically takes an LED light source as an example, but the present invention is not limited therein. Therefore, the present invention is also applicable to a light source of an organic light emitting display device, a liquid crystal display device or other similar devices, or other optical modules or equipment including light sources.

The descriptions herein are only some preferred embodiments of the present invention. It should be noted that various changes and modifications can be made to the present invention without departing from the spirit and principle of the present invention. Those skilled in the art should know that the present invention is defined by attached claims, and changes such as various possible replacements, combinations, modifications and alterations that conform to the intention of the present invention shall fall within the scope of the present invention defined by the attached claims.

SYMBOL ILLUSTRATION

1: light source device; 3: display device; 15: optical axis; 25: center; 10: upper cavity; 20: lower cavity; 30: back bazel; 40: matrix; 55: shadow; 100: lens; 110: light emitting top surface; 130; bottom surface; 150: outer wall surface; 170: hole; 171: inner wall surface; 174: concave edge; 175: opening; 190: supporting leg; 200: backlight module; 310: light emitting region; 300: light source; 400: display module; 600: placement plane; 700: fillet; 80, 800, 810, 820: light field; 900: concentric circle; 902: light field center; 904: intense light region; 906: dim light region; 908: moderate light region; 910: measuring point; 920: circular light; 930: square light; 940: turning point; 950: turning range; d: distance; D1: arrangement direction; and L1, L2: length.

What is claimed is:

1. A light source device, applied to a display module, comprising:

a lens, having a light emitting top surface and a bottom surface which are opposite, wherein the bottom surface is inwards sunken to form a hole; at least part of the hole is encircled by at least three inner wall surfaces, and an opening is formed in the bottom surface; two adjacent inner wall surfaces are mutually connected to a concave edge which extends from the opening towards the light emitting top surface; and a light source, arranged below the opening and corresponding to the hole, wherein at least part of a projection range of a light emitting region of the light source on the bottom surface is included in the opening, wherein the hole comprises:

an upper cavity, encircled by a bullet-shaped inner wall; and a lower cavity, communicated with the upper cavity and closer to the opening than the upper cavity, wherein the inner wall surfaces form the lower cavity and are respectively connected to the bullet-shaped inner wall; and the concave edges are extended until reaching intersections of the inner wall surfaces and the bullet-shaped inner wall, wherein the light source device produces an emission light field which forms a light field shape on a perpendicular projection plane; the light field shape comprises:

a light field center;

more than three intense light regions, radially arranged around the light field center; and more than three dim light regions, radially arranged around the light field center and respectively located between adjacent intense light regions, wherein a light brightness at a predetermined distance from the light field center in the dim light region is less than 90% of a light brightness at the predetermined distance from the light field center in the intense light region.

2. The light source device according to claim 1, wherein the light field shape is substantially polygonal, and the polygon has:

a plurality of corner regions, respectively corresponding to the intense light regions; and a plurality of side regions, respectively located between the corner regions and respectively corresponding to the dim light regions.

3. The light source device according to claim 1, wherein the light field shape is substantially square; after a luminance of the square light field shape is normalized, a range 2.0 times a full width at half maximum range is divided into 12 equal parts; one circular light field is extracted from each of the equal parts; and the circular light field comprises:

the light field center, the intense light regions, radially arranged around the light field center;

the dim light regions, radially arranged around the light field center and respectively located between adjacent intense light regions; and more than three moderate light regions, radially arranged around the light field center and respectively located between adjacent intense light regions and dim light regions.

4. The light source device according to claim 3, wherein one straight line is radially taken at an interval of every 22.5 degrees by taking the light field center as a standard, and each straight line is crossed with the circular light fields of 12 concentric circles, such that 16 measuring points are extracted from each of the independent concentric circles; wherein a light brightness uniformity of the 16 measuring points of two adjacent independent concentric circles of the 12 concentric circles is less than 90%.

5. The light source device according to claim 1, wherein the inner wall surfaces are arc surfaces; and a curvature of an arc formed by each of the inner wall surfaces at a position close to each of the concave edges is relatively smaller than that at a position away from the concave edges along a cross section parallel to the bottom surface.

6. A display device, comprising:

a backlight module, having:

a back bazel; and the plurality of light source devices according to any one of claims 1, 2, 3, 4, and 5, disposed on the back bazel in a matrix form, wherein two adjacent light source devices in a closest arrangement direction are adjacent to each other by the dim light regions.

7. A display device, comprising:

a backlight module, having:

a back bazel; and the plurality of light source devices according to any one of claims 1, 2, 3, 4, and 5, disposed on the back bazel in a matrix form, wherein one of the inner wall surfaces of one light source device is facing one of the inner wall surfaces of another adjacent light source device in a closest arrangement direction.

* * * * *